United States Patent
Gaarder

(10) Patent No.: US 9,702,923 B2
(45) Date of Patent: Jul. 11, 2017

(54) METHOD AND APPARATUS FOR MONITORING ELECTRIC POWER TRANSMISSION, DISTURBANCES AND FORECASTS

(76) Inventor: Pål Even Gaarder, Oslo (NO)

( * ) Notice: Subject to any disclaimer, the term of this patent is extended or adjusted under 35 U.S.C. 154(b) by 925 days.

(21) Appl. No.: 13/418,887

(22) Filed: Mar. 13, 2012

(65) Prior Publication Data

US 2012/0173174 A1    Jul. 5, 2012

Related U.S. Application Data

(63) Continuation-in-part of application No. 12/678,272, filed as application No. PCT/EP2008/061997 on Sep. 10, 2008.

(60) Provisional application No. 60/973,046, filed on Sep. 17, 2007, provisional application No. 60/976,946, filed on Oct. 2, 2007.

(51) Int. Cl.
*G01R 31/08* (2006.01)
*H02J 13/00* (2006.01)

(52) U.S. Cl.
CPC ........ *G01R 31/086* (2013.01); *H02J 13/0075* (2013.01); *H02J 13/0086* (2013.01); *Y02E 60/7853* (2013.01); *Y04S 10/522* (2013.01); *Y04S 40/126* (2013.01)

(58) Field of Classification Search
CPC .................................................. G01R 31/086
USPC ........................................................ 702/60
See application file for complete search history.

(56) References Cited

U.S. PATENT DOCUMENTS

| | | |
|---|---|---|
| 4,196,417 A | 4/1980 | Fasching et al. |
| 5,301,122 A | 4/1994 | Halpern |
| 5,729,144 A | 3/1998 | Cummins |
| 6,092,027 A | 7/2000 | Takai et al. |
| 6,265,881 B1 | 7/2001 | Meliopoulos |
| 6,639,413 B2 | 10/2003 | Whitehead et al. |
| 6,714,000 B2 | 3/2004 | Staats |
| 6,771,058 B2 | 8/2004 | Lapinski et al. |
| 6,934,655 B2 | 8/2005 | Jones et al. |
| 7,054,795 B1 | 5/2006 | Aves |
| 7,076,378 B1 | 7/2006 | Huebner |
| 7,260,424 B2 | 8/2007 | Schmidt |
| 7,519,454 B2 | 4/2009 | Gardner et al. |
| 7,979,220 B2 | 7/2011 | Scholtz |
| 8,680,872 B2 * | 3/2014 | Nowicki et al. ............... 324/539 |
| 2001/0040446 A1 * | 11/2001 | Lapinksi et al. ............... 324/126 |
| 2002/0101231 A1 | 8/2002 | Staats |
| 2002/0136314 A1 | 9/2002 | Maki |

(Continued)

FOREIGN PATENT DOCUMENTS

| | | |
|---|---|---|
| EP | 1297347 | 1/1989 |
| EP | 1030183 B1 | 3/2006 |

(Continued)

OTHER PUBLICATIONS

Okonomisk Rapport Apr. 2006 pp. 40-41.

*Primary Examiner* — Bryan Bui
(74) *Attorney, Agent, or Firm* — 24IP Law Group; Timothy R DeWitt

(57) ABSTRACT

An apparatus (10) and method for monitoring power transmission, disturbances and forecasts in a power grid is disclosed. The apparatus (10) comprises a plurality of magnetic field sensors (30) or voltage sensors (50) for measuring a change in the magnetic field (35) or voltage over time at the electric power transmission line (20).

30 Claims, 7 Drawing Sheets

(56) References Cited

U.S. PATENT DOCUMENTS

| | | |
|---|---|---|
| 2003/0144975 A1 | 7/2003 | Kawamura |
| 2004/0212512 A1 | 10/2004 | Stewart |
| 2005/0062290 A1 | 3/2005 | Stahlkopf |
| 2005/0083206 A1 | 4/2005 | Couch et al. |
| 2005/0169056 A1 | 8/2005 | Berkman |
| 2005/0187726 A1 | 8/2005 | Korba et al. |
| 2006/0291856 A1 | 12/2006 | Hampel et al. |
| 2007/0002653 A1 | 1/2007 | Jung et al. |
| 2008/0012720 A1 | 1/2008 | Rostron |
| 2008/0272934 A1 | 11/2008 | Wang et al. |
| 2009/0015239 A1 | 1/2009 | Georgiou |
| 2009/0063228 A1 | 3/2009 | Forbes |
| 2009/0281679 A1 | 11/2009 | Taft et al. |
| 2009/0315555 A1* | 12/2009 | Heger .................. G01R 15/148 324/260 |
| 2009/0326731 A1 | 12/2009 | Bowdry et al. |
| 2011/0074436 A1 | 3/2011 | Nowicki |

FOREIGN PATENT DOCUMENTS

| | | |
|---|---|---|
| WO | 0077535 | 12/2000 |
| WO | 0179872 | 10/2001 |
| WO | 2005006363 | 1/2005 |
| WO | 2006112839 A1 | 10/2006 |
| WO | 2007030121 A1 | 3/2007 |
| WO | 2008143520 A1 | 11/2008 |
| WO | 2009127706 | 10/2009 |

* cited by examiner

METHOD AND APPARATUS FOR MONITORING ELECTRIC POWER TRANSMISSION, DISTURBANCES AND FORECASTS

CROSS-REFERENCE TO RELATED APPLICATIONS

This application is a continuation-in-part of U.S. patent application Ser. No. 12/678,272 entitled "Method and Apparatus for monitoring Power Transmission" and filed on May 20, 2010, which is a national phase entry of international patent application No. PCT/EP2008/061997 filed on 10 Sep. 2008 claiming priority of U.S. Provisional Patent Application No. 60/973,046 filed on Sep. 17, 2007 and U.S. Provisional Patent Application No. 60/975,946 filed on 2 Oct. 2007. The aforementioned patent applications are hereby incorporated by reference in their entirety.

FIELD OF THE INVENTION

The field of the present invention relates to an apparatus and method for monitoring power transmission, disturbances and forecasts for an electric power transmission network.

BACKGROUND OF THE INVENTION

The traditional monopolies of electrical utility companies have been relaxed in the past few years in the European Union, in the United States and in other countries. There has developed as a result a growing wholesale electricity supply market for electrical power. Utility companies, independent power producers, and power marketers as well as brokers are some of the participants in the volatile electricity supply market. It is known, for example, that variables such as the time of day and date, weather, temperature and oil prices play a role in the pricing of electricity in a given region. Similarly, the way in which the electrical power transmission line (or power grid) and the pricing of electricity play a role for in the storage of fuel, such as oil, and other commodities.

Furthermore, the pricing of the electricity is dependent on the operational status of electricity supply generators and use of facilities as well as the transmission capacity of an electric power transmission network (also called power grid). The participants in the electricity supply markets require access to substantially real-time information as well as historical data on the operational status of the electricity supply generation and use facilities as well as the electric power transmission lines in the region. This information allows the development of trading strategies in electric power and responses to power system events (such as disruptions in the power grid due to failures of transformers).

The relaxation of the monopoly status of traditional electric utility companies has resulted in increased competition for customers among suppliers of electric power. Information relating to the use of electric power by the potential customers would be useful to those involved in the bidding for electrical supply contracts. It would also be advantageous to determine information on the supply and the demand of the electric power over time without having to directly connect to the electrical power transmission lines.

There is also a requirement to monitor the power grid in order to ensure an increasing stability of the power grid.

One of the issues related to the relaxation of the monopoly status of traditional electric utilities is the requirement to determine power system disturbances in the power grid. U.S. Pat. No. 7,519,454 (Gardner et al., assigned to Virginia Tech Intellectual Properties) teaches a system for detecting and locating the disturbance events within the power group which includes a series of frequency disturbance recorders taking measures in the power group at disparate points of the power group and an information management system which is configured to receive data from the series of the recorders and to analyze the received data. The frequency data recorders include a low pass filter to eliminate high frequency components in a measured 110V AC signal from a wall socket. The system of US '454 further includes a communications network interconnecting the series of frequency data recorders and the information management system. The information management system is configured to examine orders and patterns of receipt of the frequency changes caused by the disturbance event and to triangulate a location of the disturbance event based on the orders and patterns of receipt of the frequency changes. The teachings of the US '454 patent require the measurement of a complete cycle of the frequency to determine a change in the frequency and also lose information by eliminating the high frequencies in the 110V AC signal.

Methods and systems for the measurement for the electric power transmission are known from several prior art documents. For example U.S. Pat. No. 6,714,000 (Staats, assigned to Genscape, Inc.) teaches a method for the remote monitoring of the magnitude and the direction of net electrical power and current flow to or from a facility monitored over a prolonged period of time. The method described in the Staats US '000 Patent includes the detection and the measurement of the magnetic field emanating from the monitored electrical power transmission lines and detecting a signal that is synchronized to the power system frequency emanating from the power lines. The method further includes valuation, storing and transmission of the data on the electromagnetic field that emanates from the electrical power transmission line.

A further International Patent Application No. WO2006/112839 (Genscape Intangible Holding, Inc.) also teaches a method and a system for the substantially real-time monitoring of the operational dynamics of power plants and other components in an AC power grid. The monitoring is done by using information collected from a network of power grid frequency detection and reporting devices. The invention allows for the real-time detection and reporting of certain power grid events, such as a power plant trips or failures.

International Patent Application No. WO2007/030121 (Genscape Intangible Holding, Inc.) teaches a system for monitoring the power flow along an electric power transmission line that includes a plurality of magnetic field monitors placed at selected positions. The magnetic field monitors have two magnetometers with their sensitive axis placed either in the horizontal or vertical direction. A detailed description of such magnetic field monitors is found in U.S. Pat. No. 6,771,058 (Lapinski). The system further includes a central processing facility for the communication of the power flow to an end user.

European Patent No. EP 1 297 347 (Genscape Intangible Holding, Inc.) discloses an apparatus for remotely measuring and monitoring an electric power transmission line. The apparatus comprises a first sensor which is responsive to a first component of a magnetic flux density associated with the electric power transmission lines and which outputs a volt proportional to the magnetic flex density generated by current flowing through set electrical power transmission line. The apparatus further includes a second sensor which outputs a voltage proportional to a net electrical potential associated with the electrical power transmission line. The values for the voltage and the current flowing through the electrical power transmission line are passed to a central processing facility which combines the phase of the measured electrical potential with the phase of the measured magnetic flex density in order to determine the phase of the electrical potential relative to the magnetic flux density and that by determining from the face of the electrical potential relative to the magnetic flux density. The phase angle of the current flowing through the electrical power transmission line with respect to the voltage of the transmission line is also determined A power factor on the electric power transmission line and the magnitude and the direction of the power flowing through the electrical power transmission line is thereby calculated. It should be noted that the voltage sensor and the magnetic flux sensor are substantially co-located, as can be seen from FIG. 1 of the patent.

Other companies also measure power flowing along electric power transmission lines. For example, the Norwegian company powermonitor.org supplies information about the German power plants. Their product is described in the article "Slik drives strøm-spionasje", Økonomisk Rapport April 2006, 40-41. Another Norwegian company, Energieinfo AS, Stavern, has filed a Norwegian patent application entitled "Fremgangsmåte og apparat for overvåkning av produksjon og overføring av elektrisk kraft" (Application No. NO 2007 2653).

SUMMARY OF THE INVENTION

This disclosure teaches a method for determining a disturbance on a power grid that comprises monitoring a magnetic field at a first magnetic field sensor, determining a first change in value of a feature associated with the magnetic field at the first magnetic field sensor, and comparing the first change in the value of the feature associated with the magnetic field with a first magnetic field reference value and thereby determining a presence of the disturbance.

The first magnetic field reference value can, for example, be an updatable value which is regularly updated depending on the power grid. The feature associated with the magnetic field might be an expected waveform of the magnetic field or be calculated by using a mathematical transformation, such as the Fourier or Laplace transformation.

The determination of the change in the value of the feature associated with the magnetic field enables a quick evaluation of the disturbance in the electric power transmission network. The determination is quick, since it not necessary to determine a change in frequency of the magnetic field over several cycles and higher frequencies are not filtered out.

In one aspect of the invention, the magnetic field is sampled digitally to produce a series of digital values representative of the value of the magnetic field at known times. The greater the number of digital values, the more quickly the change in the value of the magnetic field can be determined.

In a further aspect of the invention, the shape of the change in the expected waveform of the magnetic field can be analyzed in order to look for unexpected waveform signal shapes that are indicative of over-harmonics in the electric power transmission network. The unexpected signal changes can include, but are not limited to, a gradient (first or second derivative) of the curve representing the magnetic field. A snapshot of the curve representing a few milliseconds may be sufficient to allow such unexpected signal changes to be identified.

In a further aspect of the invention a second change in the value of the feature associated with the magnetic field is determined at a second one of a plurality of the magnetic field sensors. Both of the first change of the magnetic field and the second change of the magnetic field against time can be used in order to calculate the position of the disturbance on the electric power transmission network.

The method can be further used for forecasting at least one demand for electrical power, commodity costs or power fuel value.

In a further aspect of the disclosure, the method for determining the disturbance on the electric power transmission network comprises monitoring a voltage at one or more voltage sensors. The change in the value of a feature associated with the voltage is determined and a comparison of the change in the value of the feature associated with the voltage with a first voltage reference value enables the determination of a presence of the disturbance.

The first voltage reference value can be one of an updateable value. The feature associated with the voltage might be an expected waveform for the voltage signal or calculated by using a mathematical transformation, such as a Fourier or Laplace transformation.

The determination of the change in the value of the feature associated with voltage enables a quick evaluation of the disturbance in the electric power transmission network. It is quick since it is not necessary to determine a change in frequency of the voltage over several cycles and higher frequencies are not filtered out. In some cases this determination can be achieved by using a snapshot within less than one cycle, as discussed above.

The disclosure also teaches an apparatus for determining a disturbance on an electric power transmission network that comprises one or more data lines for reception of data at least one location of a feature associated with at least one of a plurality of magnetic fields or voltages, and a processor for analyzing the received data and determining changes in the value of the feature associated with the magnetic field or the voltage, and thereby determining the disturbance on the electric power transmission network by comparison to a reference value.

In one aspect of the invention, a field description database is built. The field description database comprises close to real time power network data, including the parameters and values of power production, power flow and more generally information about state of the grid. The field description database will also store the power network data for historical purposes.

In a further aspect of the invention, a statistic and probability database for determining the probability of a state of the configuration and operation of the electric power transmission network can be built. The statistic and probability database uses the data in the field description database and historical data to describe the condition of electric power generation and electric power transmission system and also forecast the electric power transmission network's future behavior. For example, the forecast can include demand, power plant fuel value or commodity costs.

Still other aspects, features, and advantages of the present invention are readily apparent from the following detailed description, simply by illustrating embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description that follows and in part will be obvious from the description, or may be learned by practice of the invention.

DESCRIPTION OF THE FIGURES

For a more complete understanding of the present invention and the advantages thereof, reference is now made to the following description and the accompanying drawings, in which.

DETAILED DESCRIPTION OF THE INVENTION

For a complete understanding of the present invention and the advantages thereof, reference is now made to the following detailed description taken in conjunction with the Figures.

It should be appreciated that the various aspects of the invention discussed herein are merely illustrative of the specific ways to make and use the invention and do not therefore limit the scope of invention when taken into consideration with the claims and the following detailed description. It will be further appreciated that features from one embodiment of the invention may be combined with features from other embodiments of the invention.

The teachings of the cited documents should be incorporated by reference into the description.

Figure 1:
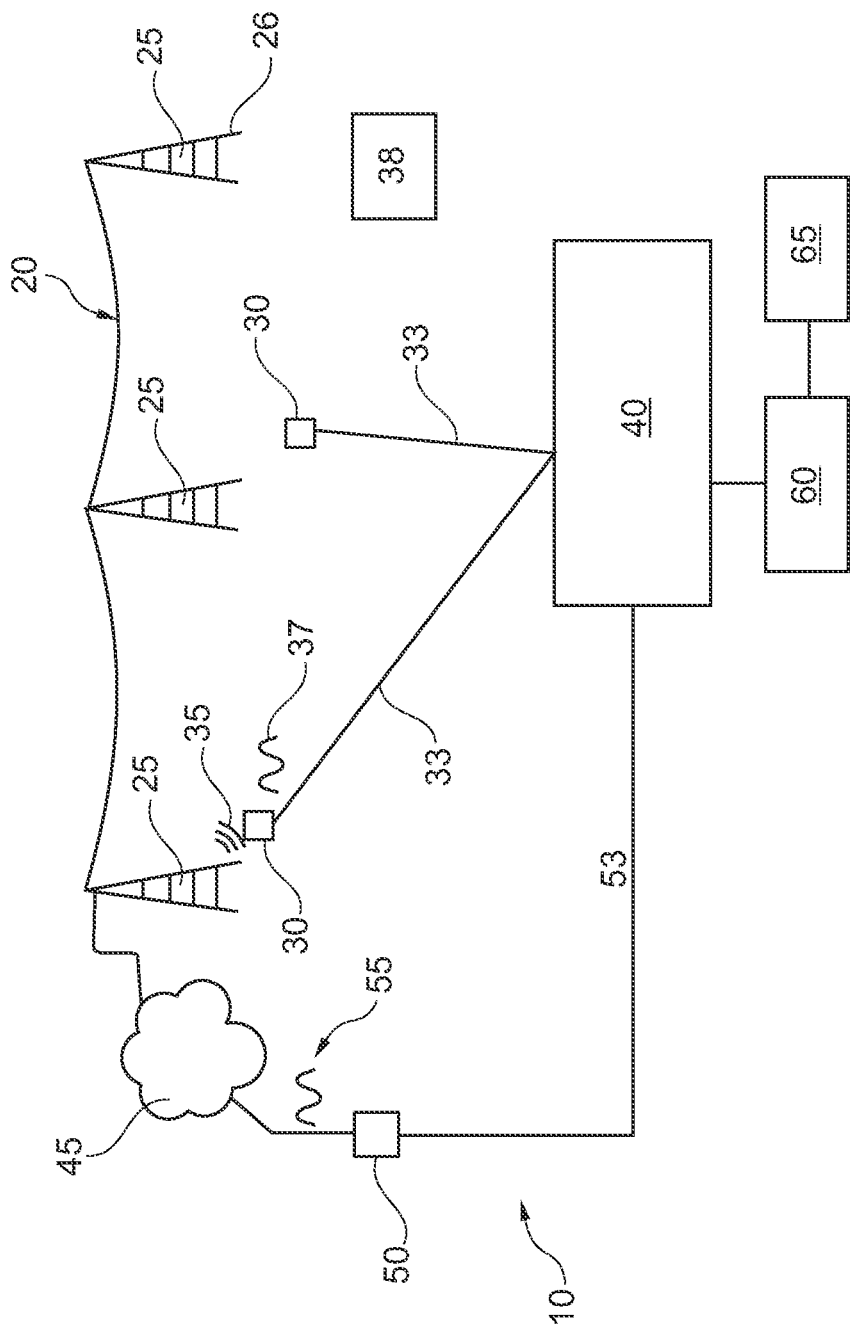
FIG. 1 shows an overview of the system.

FIG. 1 shows an example of the use of the teachings of this disclosure in a power grid. FIG. 1 shows a system 10 for the measurement of power in an electric power transmission line 20. The system 10 is part of a high voltage electrical power transmission network (also termed "power grid"), as will be explained later. The power grid is part of a power network, which also includes low voltage parts. The electric power transmission line 20 is shown in FIG. 1 as a single line strung between pylons 25. It will be appreciated that the electric power transmission line 20 will be generally made up of multiple lines strung between innumerable pylons 25. Each of the multiple lines will carry a separate current and have a magnetic field 35 about the multiple lines. It will also be appreciated that the electric power transmission lines 20 may be laid on a surface or buried underground.

One or more magnetic field sensors 30 are mounted at a distance from the electric power transmission line 20. The magnetic field sensors 30 measure the magnetic field 35 generated by the electric power transmission line 20. The magnetic field 35 can be measured in a X-direction and a Y-direction that are generally orthogonal to each other.

Advantageously the one or more magnetic field sensors 30 are arranged close to a base 26 of the pylons 25. This is because the electric power transmission line 20 sags between any two of the pylons 25. The sag of the electric power transmission line 20 will increase in hot weather and also the electric power transmission line 30 may move during storms due to wind. The movement and/or sag of the electric power transmission line 30 will affect the magnetic field 35. If, however, the magnetic field sensors 30 are arranged close to the base 26 of the pylons 25—at which point the electric power transmission line 20 is fixed—then the sag and/or movement of the electric power transmission line 20 will be substantially eliminated. The movement and/or sag of the electric power transmission line 20 is described in the Applicant's pending patent application No.

Typically the magnetic field sensors 30 are placed between 25m and 400m from the electric power transmission lines. The exact coordinates of the magnetic field sensors 30 are measured, for example, using the Global Positioning System (GPS), as the information about the exact coordinates is needed to identify the electric power transmission line 20 being measured but also to calculate the power being transmitted over the electric power transmission line 20 and to record disturbances in the power grid, as will be explained later. It will, however, be appreciated that other means may be used to determinate the exact co-ordinates of the magnetic field sensors 30, such as the European Galileo system or trigonometric measurements. The signals supplied by the GPS system may also be used to obtain highly accurate time signals, as will be explained later. Highly accurate time signals can also be obtained from a mobile communications network.

It will be further noted that FIG. 1 shows only two of the magnetic field sensors 30 arranged at the base 26 of two of the pylons 25 of the electric power transmission line 20. It will be noted that it is not necessary to have multiple magnetic field sensors 30 per pylon 25 or electric power transmission line 20. Generally, there will be one magnetic field sensor 30 for one single electric power transmission line 20, and n or less magnetic field sensors 30 if n electric power transmission lines 25 are close. The term "close" in the context of this disclosure means typically less than 1 km and usually only a few tens of meters. For example if there are two electric power transmission lines 20 at 30m distance (or two electric power transmission lines 20 at the same pylon 25) it is possible to use a single magnetic field sensor 30 (which measures both the magnetic fields in the X-direction and the Y-direction and the phase/time). The reason for this is that the time is measured very accurately using the GPS system and the peak of the magnetic field signal is also accurately measured. By inspecting the phase difference between the measurements in the X-direction and the Y-direction made by the magnetic field sensors 30 (inside the same measurement unit) is possible to solve the equation for the direction and magnitude of a current flowing in two electric power transmission lines 20 if, at the same time, the geometry of the electric power transmission lines 20 and the placement of the measurement unit with the magnetic field sensors 30 is known. The measurement is either done in real time (inside the measurement unit) or one needs to time tag the magnetic field measurements of both the X-direction and the Y-direction very accurately and do the computation afterwards. For calibration of the system 10 it is possible to use several measurement units with a plurality of the magnetic field sensors 30 at the same electric power transmission line 20 for a period of time.

FIG. 1 also shows a processor 40 connected to the plurality of magnetic field sensors 30 by first data lines 33. The first data lines 33 transfer in substantially real time magnetic field data 37 representing values of the magnetic field 35 measured by the magnetic sensor 30. A voltage sensor 50 is also connected to the processor 40 by second data lines 53. The second data lines 53 transfer in substantially real time voltage phase data 55 to the processor 40. The voltage sensor 50 is placed in the low voltage part of the electric power transmission network in this aspect of the disclosure. The low voltage part of the electric power transmission network is connected through transformers and other lines (represented by reference numeral 45) to the high voltage power grid. In one aspect of the invention, the low voltage part is a domestic household or industrial supply at 230 V (or 110 V in the United States).

It will be noted that the processor 40 does not need to be situated close to the plurality of magnetic field sensors 30. Similarly the processor 40 does not need to be situated close to the voltage sensor 50. The voltage sensor 50 needs to be connected to the same AC network as the electric power transmission line 20. In other words, there can be no DC connection between the voltage sensor 50 and the electric power transmission line 20. In Europe this requirement is met, for example, in the electric power grid of central Europe (i.e. Germany, Denmark, Netherlands, Belgium, France) and the electric power grid of Scandinavia (Sweden, Norway).

FIG. 1 also shows a clock 38. The clock 38 is highly accurate and is used to send time signals to local clocks at the magnetic field sensors 30 and the processor 40. The clock 38 could be part of the GPS system. It is known, for example, that the GPS satellites in orbit transmit accurate time signals. The clock 38 could also be an earth-based atomic clock.

It should be further noted that the processor 40 does not need to be situated in any specific country since the processor 40 can acquire the magnetic field data 37 and/or the voltage waveform data 55 remotely. It will be noted that it is possible for the processor 40, the magnetic field sensor 30 and the voltage sensor 50 to be in different countries.

A transform phase calculator 60 is connected to the processor 40. Typically the transform phase calculator 60 will be implemented as a software module running on the processor 40, but the transform phase calculator 60 could also be implemented in hardware (as an ASIC chip) or run on a second processor (not shown). In one aspect of the invention the transform phase calculator 60 and routines and algorithms used by the transform phase calculator 60 have access to a look-up table 65 implemented as a database. This aspect of the invention will be explained in more detail later in connection with FIG. 2.

The system 10 shown in FIG. 1 is able by use of the magnetic field data 37 to determine the direction of the current flowing in the electric power transmission line 20 as the U–1 phase angle (to be explained later) and other power grid parameters. The other power grid parameters include, but are not limited to the configuration of the power grid, capacitive load, and HVDC load.

The system 10 is able to monitor and evaluate frequencies in the electric power transmission line 20. The frequencies include not only the nominal frequency (50 Hz in Europe; 60 Hz in US) but also higher and lower frequencies as and when required.

It will be recognized that the first data line 33 and the second data line 53 do not have to be physical cables or other fixed lines. The first data line 33 and the second data line 53 could also be constructed from the General Packet Radio Service (GPRS) over the GSM mobile communications network. Alternatively the first data line 33 and the second data line 53 could be implemented over mobile communications network LTE mobile communications network, RF, satellite etc. The use of the mobile communications network requires significant amount of power consumption for the establishment of upstream data channels and/or downstream data channels as short intervals of data relating to the magnetic field data 37 and the voltage waveform data 55 will need to be established and transferred across the mobile communications network. In one aspect of the invention the magnetic field data 37 and/or the voltage waveform data 55 is not sent in real-time to the processor 40. Instead the magnetic field data 37 and/or the voltage waveform data 55 is temporarily stored and transmitted in bursts of data packets across the mobile communications network. This procedure increases the time between each data transfer and thus reduces the rate of establishment of connections. The use of the fixed line communications network reduces the power consumption.

The apparatus 10 of the invention allows the determination of configuration of the power grid and conditions of the power grid as well as to identify power system disturbances in the power grid. Thus, the apparatus 10 will provide information about the situation concerning the power production and power grid, and can also compare this information with respect to expected conditions. The determination of the power grid can be useful to an independent power provider who does not have access to information relating to the structure of the power grid (which is held by the operator of the power grid).

Disturbances in the power grid are caused either by devices connected to or present in the power grid, the power grid itself or environmental effects surrounding the power grid. The devices connected to or in the power grid include, but are not limited to, power plants, voltage transformers, phase adjusting devises as capacitor banks, switches, HVDC transformers, consumers as commodity factories, pumping power plants etc. The environmental effects that can disturb the power grid include, but are not limited to, electrical noise in the environment, such as solar storms, weather, change in fuel access/stock (oil, gas, water etc.). The environmental effects also include the effects due to material in the environment that might physically destroy the power lines and pylons in the power grid. Such materials are, for example, trees, or buildings.

The disturbance in the power grid will affect the preferred and normal behaviour of the power grid. A preferred and normal behaviour on an AC (alternating current) power grid is a given voltage—current phase relationship and a given waveform of the alternating signal. A normal waveform of the alternating signal is a sinus wave of the nominal frequency (50 Hz Europe and 60 Hz US).

Examples of the disturbances to be measured by the teachings of the invention are:
  Change in the slope of the waveform of the alternating signal. If a load above the capacity of the power grid is applied to the power grid, then the power grid will not be able to raise (or decrease) the voltage and current of the electric power carried in the power grid as fast as is preferred. By measuring the slope of the waveform and comparing the measured slope with an expected slope, one will be able to determine an instability in the power grid.

Deviations from a perfect sinus curve as the waveform. As an example if a transformer in the power grid start to go into saturation mode, then the waveform will be deformed.

Change in the voltage—current phase of the alternating signal.

Over-harmonic and frequencies below the nominal frequency of the alternating current.

The disturbances can be seen when compared with a reference value at a single point measurement at a given time, as two single measurements with a given gradient per time, as a series of single measurements representing a shape, as a transformation of several single measurements into a new domain (for example into the Fourier, Laplace and/or frequency domains).

When the disturbance is located, the origin of the disturbance can be found by either one or several of the methods outlined below:

Compare the located disturbance with a set of known examples of disturbances. For example, it can be checked to see if the located disturbance is associated with a given transformer, or if the disturbance is known to be associated with a given load mode of the power grid, etc.

Compare the disturbance at different locations within the power grid. For example if the disturbance is smoothed out at another location within the power grid, one can assume the location of the disturbance is in the direction at which the disturbance is strongest.

Measure the time difference at which the disturbance are measured at different locations on the power grid. The distance to the location of the disturbance is given by multiplying the time by the transfer function.

When the disturbance or disturbances are found and/or located, one can evaluate the current state of the power grid and forecast the probability for the states in the future. This evaluation and forecast can be done either by an analytic calculation and a grid simulation, and/or by with a set of known or pre-defined grid states.

An example of a scenario can be: knowing the state of the power grid historically, knowing the current state of the power grid at the current time, now; and then measuring a disturbance. Since the historical and current state of the power grid are known, then on detection of a disturbance, it is possible to calculate the probability for a power outage in a certain area.

A further example would be as follows. It is known, from public information, that, due to maintenance, reserve capacity of power plant production is limited. It is also known that the "South" power plant has a maximum power production that is limited to run at 105% capacity for 30 min, and needs to be at 60% capacity for a minimum of 3 hours thereafter. The historical data teaches us that, with X % probability, the consumption of power over the next hours will be at a certain level. We have measured the consumption on the power grid to be as expected from the historical data and we have measured the "South" power plant to have produced at 105% for 29 minute. We suddenly measure a signal indication saturation in the transformer from another power plant—called "North". Using this information, we can estimate and forecast a of low power production in the area both the short term and in the long term. For example, it can be forecast that the probability for a black out in a certain area is x % and will last for 3 hours due to both of the power plants "South" and "North" having concurrent problems. It is also possible to calculate the probability that the cost of the power will increase in the area due to a long term lack of power due to the problem in the "North" power station.

A further example would be as follows. An unexpected electricity production pattern is measured. By comparing with the electricity price historically, electricity price in real time now and electricity price forecasted one can find the power plants fuel cost just now and/or the power plants self forecast for future fuel cost and fuel value.

The processor 40 can use the information gained from the magnetic field sensors 30 and the voltage sensor 50 to simulate the actions of producers of electric power, operators of the power grid and consumers. This provides information that can allow suitable action to be taken to match demand for electric power with the availability of electric power. For example, if there is lack of electric power in Italy, a generating station in Spain may be manually called in to add to capacity of the electric power on the power grid. The system 10 can evaluate or predict that such an action has already been done or—using available historical data—will be done by a generation station operated by the electric power producer in Spain.

In one aspect of the disclosure, the processor 40 can simulate and determine the probability for development of different scenarios and different modes of operation of the power grid on measuring the disturbance, as discussed above. This can be done by, for example, using state estimators and Monte Carlo methods. A state estimator is a system that models a real system in order to provide an approximation of the internal state of the real system, given measurements of the input to the real system and the output of the real system. The state estimator is typically implemented as a mathematical model on a computer. The state estimators are built up by empirically monitoring the input and recording the output for a series of scenarios. On the other hand, Monte Carlo methods are a class of algorithms that use repeated random sampling to compute the results. Similarly the Monte Carlo methods are implemented on a compute.

In one aspect of the disclosure, the processor 40 can use substantially real-time data together with historical data (stored in a database) in the simulations. The processor 40 can evaluate how these simulations may impact on the operation of the power grid and the probability of entering into changed modes of operation. In addition to the magnetic field data 37 and the voltage waveform data 55 the simulations can include historic data such as weather data, network configuration data, time-related data, energy price, energy reserves. These simulations can provide probabilities for the power production and the power grid to identify scenarios different from expected behavior.

In a further aspect of the invention, multiple ones of the magnetic field sensors 30 spread out are used in the same area. The magnetic field sensors 30 could either be mounted inside the same measurement unit or the magnetic field sensors 30 can be found in several different measurement units at different locations. By associating a time measurement to each magnetic field measurement for each one of the magnetic field sensors 30 one can afterwards compare the phase and the magnitude of each of the magnetic field measurements in the different locations. One can perform calculations to find either an unknown geometry of the electric power transmission lines 20 and/or measure multiple ones of the electric power transmission lines 20 with additive magnetic fields.

In a further aspect of the invention, a reference generator can be incorporated which can be either fully or partly in phase with noise in the magnetic field sensor 30 and induced in the magnetic field sensor 30 by the electric power transmission line 20. The source of the noise can be, for example, from the electric field surrounding the electric power transmission line 20. The magnetic field sensor 30 calculates the power and the direction of the power in the power transmission line 20 using the measured magnetic field and the reference generator.

The principles behind the invention will now be explained. It is known that power (P) is the product of voltage (V) and current (I), i.e.:

$$P = V * I \qquad \text{Eqn. (1)}$$

Any approach to the measurement of electrical power flowing through an electrical power transmission line 20 must be based on the direct measurement of or derivation of current I and the voltage V flowing through the electrical power transmission line 20. The sign of the product of the voltage U and the current I gives the sign of the power P. For time periods of less than a half cycle (i.e. <10 ms at 50 Hz) Eqn. (1) is approximately valid both for DC and AC power.

The current I is measured in the invention using the magnetic field sensors 30 disposed along the electrical power transmission line 20. The magnetic field sensors 30 measure the magnetic field 35 associated with the electrical power transmission line 20. The current I through the electrical power transmission line 20 can then be calculated in accordance with Ampere's Law and the Biot-Savart law. Standard vector calculus, 1D, 2D or 3D with one or several orthogonal magnetic field sensors 30 can be used if several different electric lines in the electrical power transmission line 20 contribute to the magnetic field 35 or if the electric lines do not have an one dimensional shape (for example due to sagging, as discussed above).

If the voltage V and the current I were always in phase with each other in the electrical power transmission line 20, then the scalar product of measured RMS voltage and measured RMS current would always indicate the instantaneous power in the electrical power transmission line 20. In other words, the real power is the same as the apparent power.

However, in AC power systems, the voltage V and the current I are not exactly in phase, owing to the fact that loads may be reactive rather than resistive. This is due to the inductance and capacitance of the components (electric lines, cables, transformers etc.) making up the power grid. In other words the real power (i.e. power available for useful work) is less than the apparent power. This gives rise to the power factor (the ratio of real power to apparent power) being less than unity and therefore the phase difference between the voltage V and the current I must be determined in order to obtain an accurate computation of the power. The difference in phases between the voltage V and the current I is particularly noticeable at low electrical power flows and when faults occur in the power grid. The phase difference between the voltage V and the current I will also be significant for a time. The phase difference will end up at 180° when the power changes direction.

Figure 2:
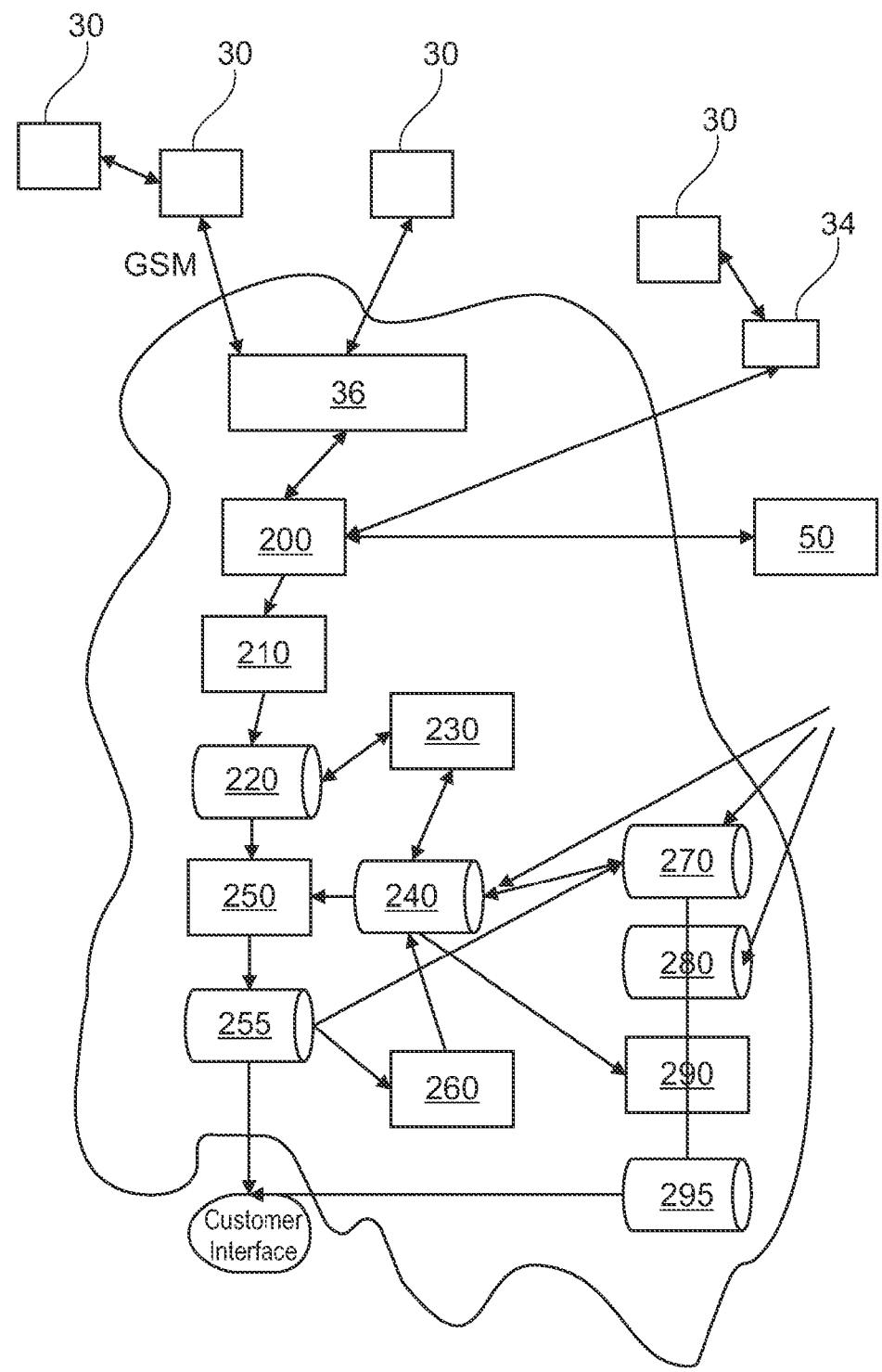
FIG. 2 shows an overview of the processes and the dataflow in the system in more detail.

FIG. 2 shows a more detailed overview of the processor 40 according to the current invention. FIG. 2 shows the magnetic field sensors 30 located close to the electric power transmission lines 20. The magnetic field sensors 30 are connected to each other or to a mobile data access interface 36 via radio or through the mobile communications network (as discussed above) or fixed line. The wireless magnetic field sensors 30 may also be connected to a wireless LAN transceiver 34. The mobile data access interface 36 and the LAN transceiver 34 are connected to the processor 40 through the Internet.

The processor 40 comprises an authentication check 200, which is connected to the mobile data access interface 36 and the wireless LAN transceiver 34 to authenticate the data received at the processor 40. The authentication check 200 is also connected to the voltage sensor 50. It should be noted that there might be more than one voltage sensor 50 which may be placed in the same facility as the processor 40. The data from the magnetic field sensors 30 and the voltage sensor 50 is processed in the raw data storage processor 210 before being stored in the raw data databases 220.

A field description database 240 contains a set of configuration data that describe a given configuration of the power grid. For example, a data set could describe the configuration of the Scandinavian power grid in which each of fields in the data set describes the given configuration of each of the individual parts of the power grid, for example a closed breaker. The field description database 240 includes, but is not limited to data concerning states of breakers, a capacitor coupled to the power grid, the connections of the electric power transmission lines 20, the length of the electric power transmission lines 20, transformers etc. Another dataset could be exactly the same as the first data set except that one of the breakers has a different state, for example open. Part of the datasets and the data in the field description database 240 are obtained from public information or by manually inspecting the power grid. The rest of the dataset will mainly be calculated manually by inspecting the measured values or calculated automatically in accordance with this invention.

The processor 40 continuously monitors the data supplied by multiple ones of the magnetic field sensors 30 and the voltage sensors 50 in the system and calculates the configuration of the power grid at a given time. By such means, it is possible for the processor 40 to determine the given configuration for the power grid at a given time and to use the field description database 240 as a look-up table for input in a grid configuration process 260. Let us take an example. Suppose that the processor 40 detects a rapid change in the U×I phase angle from 15 degree to 2 degree within 10-60 s. The processor 40 will then inspect the current data set in the field description database 240 and in so doing determine that this change of the U×I phase angle is typically (or can only be) because one of the breakers changed from a closed state to an open state. An additional capacitive load made the power grid more reactive (which leads to a reduced phase angle) and less real power. The grid configuration processor 260 will then update the current state in the field description database 240 to fit the new calculated configuration of the power grid.

If there is a new configuration in the power grid which does not match any of the existing states in the field description database 260, the grid configuration processor 260 will either try to define a new state and inform the operator about the new state, or the grid configuration processor 260 will issue an alert and ask for assistance from an operator.

A statistics and probability database 270 continuously maintains statistics and determines probabilities for the state of the power grid. One example would be the expected power flow to a given consumer at a given day and time. For example, in a given one of the electric power transmission lines 20 at a given time, the probability for a power flow of 60-100 MW might be determined as 68%, the probability of a power flow greater than 160 MW as 22%, and the probability of a power flow greater than 120 MW as 32% etc.

An economic features database 280 contains information related to indirect parameters that can influence the states and actions of the power grid. These indirect parameters include history, real-time and future parameters such as weather forecast, fuel prices, water value, etc.

An estimator module 290 obtains the current state from the field description database 240, obtains statistics and probabilities from the statistics and probability database 270 and the economical features database 280 and constructs new possible grid states with an estimated probability. The new possible grid states are, for example, stored in a databases mirror database 295. The new possible grid states can use algorithms to forecast fuel value at individual power plants, future demand or commodity costs.

In addition, there are a number of processes and databases that monitor the entire system and perform quality control, SMS handling, VPN security, calibration etc.

Figure 3:
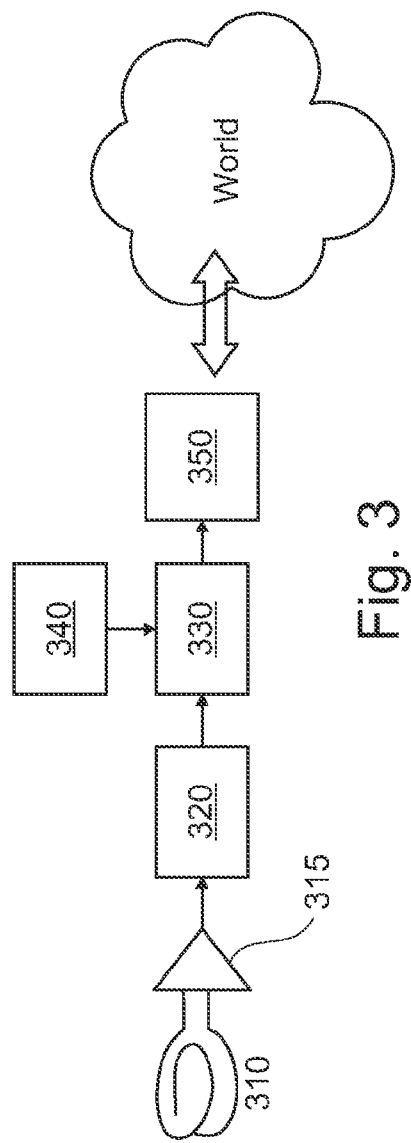
FIG. 3 shows the magnetic field sensor

FIG. 3 shows an example of the magnetic field sensor 30 that comprises one or more sensing coils 310 connected to an amplifier 315 and then to an analog-digital converter 320. As discussed above, the magnetic field sensor 310 measures the magnetic flux in the field close to the electric power transmission lines 20 in real-time and is typically placed 25 to 400m away from the electric power transmission line 20. The magnetic field sensor 30 is typically configured to measure at suitable time intervals, but also if needed may be configured to measure the change of the flux of the magnetic field continuously. The measurements taken of the magnetic field may be the bottom-peak value, the integral, the shape, the frequency etc. The design of the magnetic field sensor is described in the applicant's co-pending applications U.S. Ser. No. 13/118,696 and GB 1109208.9, both filed on 31 May 2011.

The magnetic field sensor 30 further includes a microprocessor 330 which processes the digital values from the A/D converter 320 and a global positioning and time unit 340 which measures the exact position of the magnetic field sensor 30, usually using the GPS system and also the time. The magnetic field sensor 30 typically includes a mobile data transmission module 350 for transmitting the data to the processor 40.

In one aspect of the invention, 220 kilo-samples per second are processed and stored by the microprocessor 330. In other words, the A/D converter 320 has 440 digital values for each nominal period of the current (at the European 50 Hz standard). This means that the microprocessor 330 (or the processor 40) can quickly determine changes in the frequency of the magnetic field.

The magnetic field sensor 30 has an exact known position in space. This position is calculated using the global positioning and time unit 340 or could be done using trigonometric measurements. The global positioning and time unit 340 with the microprocessor 330 is able to very accurately tag all of the measurements with the given time at the given place of the magnetic field sensor 30. In combination with the overall global position and timing system it is therefore possible for the processor 40 to treat all of the magnetic field sensors 30 in the system as a single composite unit which virtually operates in substantially real-time.

Let us take an example. Consider a 50 ms long snapshot of the current signal over the whole power grid taken at the same time. The electric power transmission lines 20 surrounding the magnetic field sensors 30 have an exact known position in space. This known position can be either be relative to the magnetic field sensors 30, can be obtained from official information such as maps etc., or from measurements made using mobile GPS units, etc. Using this known position, it is possible to make a mathematical model of the magnetic field at which the magnetic field sensor 30 is placed and to set up equations describing how the magnetic field is dependent on the current in the electrical power transmission lines 20. Basic linear algebra, for example, can be used to solve these equations.

The Global Grid Position and Timing system (GGPT) units 340 are placed in all of the measurement units such as the magnetic field sensors 30, the processor 40 and the voltage sensor 50 and provide accurate time data for all parts of the system. The GGPT units 340 are represented on FIG. 1 as the clock 38. The GGPT units 340 allow spatial data to be computed based on geometry and the variation of signal speed with time. The GGPT units 340 have an accuracy and resolution typically down to nanoseconds and less than one meter in time and space. The accuracy serves as the basis for evaluating the transfer of a given power signal on the power grid from one location to another location. In a further aspect of the invention the time is measured as the point at which the voltage signal crosses the average voltage value.

The nominal power signal on the power grid has a nominal frequency of 50 Hz in Europe and 60 Hz in the US. The nominal power signal has a substantially sinusoidal form. In theory, it would not be possible to extract one period from another in a perfectly linear network. But due to imperfections in the power grid, there are variations in frequency (of approximately a few hundred mHz) and the power signal has an imperfect sinusoidal form due to disturbances from the power producers in accuracy in power production devices installed in the power grid, resistive, inductive and capacitive loads, the power grid itself and noise from the consumers. This will lead to overlying frequencies (for example harmonics) of the nominal frequency. These unique mixed signals, naturally self-generated on the power grid, can then be handled as input and output in a network analyzer. These overlying frequencies give the waveform of the magnetic field or the voltage a unique "signature". The signature is indicative of different types of disturbances.

Figure 4:
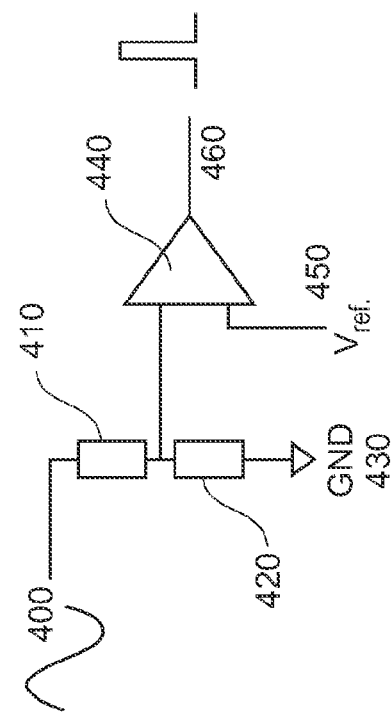
FIG. 4 shows the voltage phase sensor

The function of the voltage sensor 50 is to measure the phase of the voltage signal. As discussed above, the voltage sensor 50 is typically located in an office, near a centralized computer or at a position where there is very low noise on the voltage signal. FIG. 4 shows a schematic diagram of the voltage sensor 50 according to a first aspect of the invention.

The voltage sensor 50 in the first aspect of the invention includes a comparator 440. One input of the comparator 430 is connected between a voltage divider formed from resistances 410 and 420. One input of the resistance 410 is connected a domestic power outlet (typically 220V AC in Europe) 400. One input of the resistance 420 is connected to ground 430. It will be noted that the domestic power outlet 400 can be several hundreds of kilometers from the power grid in which the power flow is calculated. This is feasible as long as a transfer function between the locations of the power grid and the location of the voltage sensor 50 is known or can be calculated, as is described in the Applicant's co-pending patent application Ser. No. 12/678,272 filed on 10 Sep. 2008, the teachings of which are incorporated by reference.

The other input of the comparator 440 is set to a fixed and very stable threshold voltage, $V_{ref}$ at 450 which close to 0 volt. An output 460 of the comparator 440 will typically go high when the input from the voltage divider is equal or larger than the threshold voltage $V_{ref}$ at 450. The actual magnitude of the fixed threshold voltage $V_{ref}$ is not important and may be unknown, but the fixed threshold voltage $V_{ref}$ is stable over time. Optionally, the threshold voltage could be given as the average of the maximum and minimum of the peak voltage measured at the domestic power outlet 400. The comparator 440 has a type of hysteresis so the output 460 is given only when the input voltage from the voltage divider goes from negative to positive. In an alternative aspect of the disclosure, the hysteresis is not needed. However, it has been discovered that if no hysteresis is used it will slightly complicate the operation of the voltage sensor 50 and the subsequent calculations in the GGPT unit 340. The duration of the high output at 460 from the comparator 440 does not need to be known. The duration should be sufficiently high, e.g. higher than 100 µS so to allow a microcontroller for example to use the start of the ramp of the output of the comparator as an input. The comparator 440 is typically turned on every time a trigger is to be used by the GGPT, e.g. example every 10 s.

In a further aspect of the invention, the time is measured as the point at which the voltage signal crosses the average voltage value.

In a further aspect of the invention, the voltage sensor includes a microprocessor (not shown) which processes digital values from an A/D converter. Typically 220 kilosamples per second are processed and stored by the microprocessor. In other words, the A/D converter has 440 digital values for each nominal period of the current (at the European 50 Hz standard) similarly to the magnetic field sensor 30, this means that the microprocessor (or the processor 40) connected to the voltage sensor 50 can quickly determinate changes in the frequency of the voltage.

In a further aspect of the invention, the voltage sensor also is used to analyze and find disturbances in the power grid. This is example done as given in above either in a standalone manner or in combination with several voltage sensors and/or magnetically field sensors.

Figure 5:
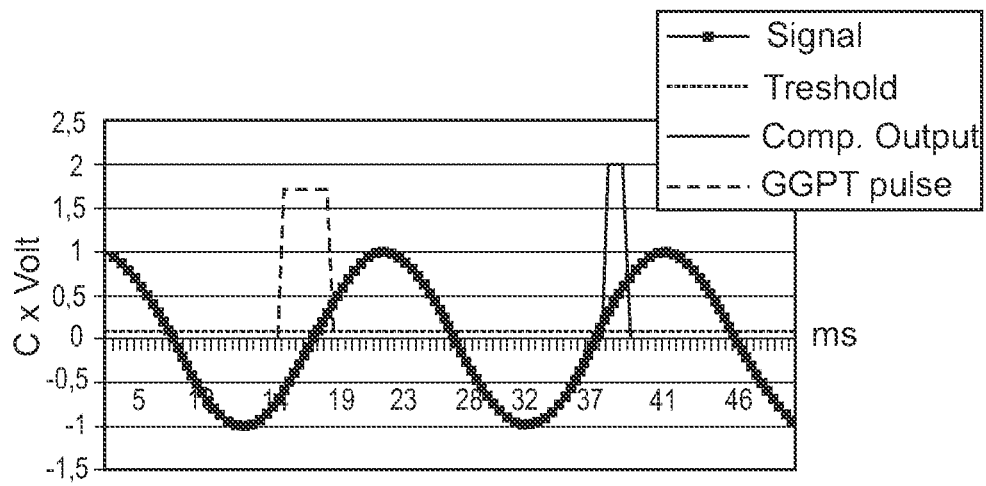
FIG. 5 shows the trigger signal from the voltage sensor

FIG. 5 below compares graphically an input signal for the GGPT (IN) and the trigger signal (TR) generated from the comparator 440.

The calculation of the U–I phase angle by use of the GGPT unit 340 will now be explained. Suppose it is required to calculate the U–I phase angle at a given location on the power grid. The common way to calculate the U–I phase angle is to subtract the time difference between the sinusoidal current waveform I and the sinusoidal voltage waveform U where they both cross the time axis and then transform the time difference to an equivalent phase difference in radians based on the known time period.

The magnetic field sensor 30 tags all of the measurements of the sinusoidal current waveform I with exact times using the GGPT unit 340 at a first given location. At, or at almost (for example ±5 s) the same time, the voltage sensor 50 gives an exact time for the sinusoidal voltage waveform somewhere else using the GGPT unit 340 at a second given location. By the use of lookup tables for the transfer function of the voltage from the first given location to the second given location, it is possible to calculate the timing of the voltage waveform U at the same place and time as the first given location at which the current measurement was done. This then allows the matching of the period of the current waveform I and the period of the voltage waveform U at a given place and time.

The voltage sensor 50 can output a pulse and time tag for every period (i.e. every ⅟₅₀th second in Europe or ⅟₆₀th second in the USA) or at intervals of several seconds. To avoid too large a quantity of data in the database 220, the voltage sensor 50 does not normally output a time tag for every period of the voltage waveform U. If the voltage sensor 50 does not output a time tag for each period, the time must be adjusted to fit the given period measured by the magnetic field sensor 30. Specifically, the adjustment is needed to extrapolate the elapsed time period owing to slight fluctuations of the actual time period relative to the nominal time period of the power grid caused by frequency fluctuations.

The correction time is given by the Equation:

$$n \cdot time\_period \cdot adjustment \qquad \text{Eqn. 2}$$

where n is the number of period mismatches between the two measurements at the first location and the second location, time period is the nominal time period of the power grid and is given by 1/f where f is the AC supply frequency (typically 50 Hz or 60 Hz) and adjustment is an adjustment value derived from an adjustment table. This adjustment table is continuously being built up by the voltage sensor 50 that normally makes measurements in shorter periods than the magnetic field sensors 30.

This adjustment table will typically include several records. For example, the adjustment table can have a record with a field n and a field "adjust". In the initial record, the field n can, for example, have the value 45678 and adjust the value 20.001 that indicates that the time period was 1 µs longer than nominal time period at the time of the recording of the initial record. 25 periods later another record is created and the value of n=45703. The adjust value is 20.0015 which indicates a period time 1.5 µs longer than the nominal time period. Similarly at a further 25 periods the value of n=45728 and the adjust values is 20.002—indicating a period time 2 µs longer. If the magnetic field sensors 30 carry out the measurement of a period which is 55 periods after the initial record and the voltage sensor 50 performs the measurement 50 periods after the initial record (i.e. at the second record above) we can now interpolate from the adjustment table the delta t the peak of the voltage waveform which will have changed over the 5 periods at which the measurements made by the magnetic field sensors 30.

It will, of course, be noted that if the voltage sensor 50 and the magnetic field sensors 30 perform the measurements at the same period this adjustment will not be needed.

The lookup tables for the transfer function stored in the field description database 240 are predefined and pre-calculated continuously mainly by the configuration module 260.

The GGPT unit 340 is able to generate an electrical pulse at the same relative time all over the power grid, or at least a pulse that is afterwards possible to calculate backwards to give a relative time tag all over the power grid. An example of a time pulse from the GGPT unit 340 is shown in FIG. 5. The time difference $\Delta_{tV}$ can be measured between the ramp of the time pulse (IN) generated by the GGPT unit 340 and the ramp of the comparator output 460 shown as the threshold in FIG. 5. As an example in FIG. 5 $\Delta_{tV}$ is approximately 23 ms. The time transfer function for a voltage signal in the power grid at the given grid configuration has previously been determined to be $U_{t\_trans}$ (condition, x, y, z) and in this case is stored in the lookup tables in the field description database 240 and is found to be 12 ms. One example of this can be the propagation time from a given place in Spain to a given place in Poland. By now adjusting for the calibration of the system and taking into account the adjusted transfer function this will give us the unknown phase time U (t, x, y, z) of the voltage at any known place at any location on the power grid.

Let us take as an example at a location A having the co-ordinate (x, y, z) where a given magnetic field sensor 30 is located, the current at the magnetic field sensor 30 at the location A (x, y, z) will have the same time difference $A_{tl}$ relative to the time pulse from the GGPT unit 340. So the U×I phase at which the magnetic field sensor 30 is located will be given by:

$$U \times I \text{ Phase(condition},t,x,y,Jz) = (\Delta_{tl} - (\Delta_{tl} + n \cdot \text{time\_period} \cdot \text{adjustment}_n) - U_{t\_trans}(\text{condition},x,y,z))^* 2\pi / T \quad \text{(Eqn. 3)}$$

where T is the time period of the AC supply.

Figure 9B:
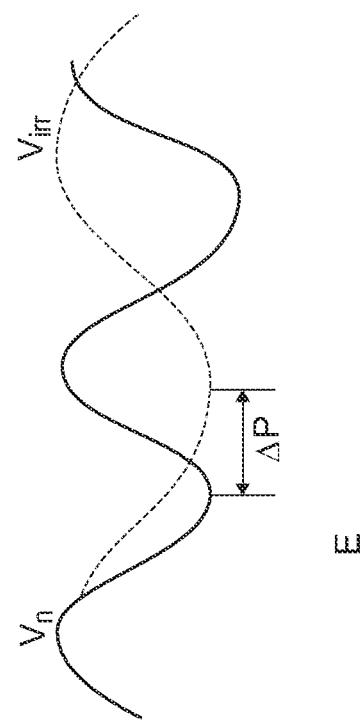
FIGS. 9A and 9B illustrates a change in phase due to a disturbance in a power grid.
Figure 9A:
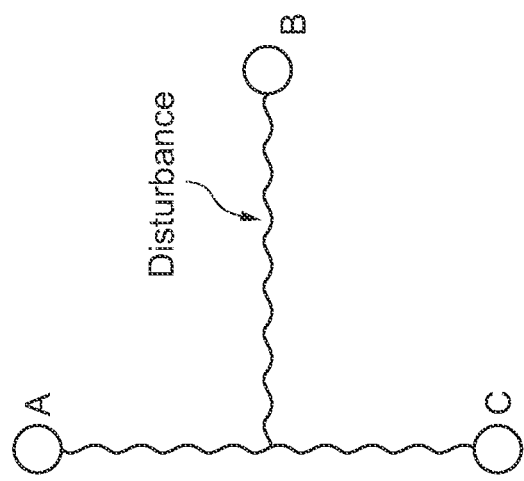

The method of the invention can be used to determine disturbances on the power grid. Let us suppose that there is a problem with one of the power stations A, B or C connected to the power grid, as shown in FIG. 9A. Such problems could include, for example, an increase in the load attached to the electric power transmission line 20, an interruption in the electric power transmission line 20.

Such extra loads or interruptions have a variety of causes. For example, it is known that trees may bring down one or more of he electric power transmission lines 20 during a storm. Alternatively, the switching-out the unexpected switching-out of one of the power stations A, B or C could lead to substantial extra load being placed on the operating ones of the other power stations A, B or C. Another example could be the saturation in a transformer at a grid station or switching element in the electric power transmission element. It is also known that solar storms will cause disturbances in the electric power transmission "network (see "Philips" Serve Space Weather network—Social and Economic Impacts—NASA Science" downloaded on 1 Dec. 2011. The extra loads or interruptions will result in a change of the phase of the magnetic field about the electric power transmission line, as is shown in FIG. 9B at point E. FIG. 9B shows the normal or regular magnetic field $B_n$ about the electric power transmission line 20 as a continuous line and the changed magnetic field $B_{irr}$ as a dotted line. It will be observed that there is a change in the slope of the line representing the field. The skilled person will note that the illustration of the changed magnetic field $B_{irr}$ is shown substantially greater on FIG. 9B than it would be in reality. The change in the value of the field $B_{irr}$ can be seen from reviewing different ones of the digital samples of the value of the magnetic field $B_{irr}$.

The exact time is known at each one of the magnetic field sensors 30 measuring the changed magnetic field $B_{irr}$ which are located near the power station A, B, C as well as at other locations within the power grid and thus the exact time at which the change of the field $B_{irr}$ occurs is known. Each of the magnetic field sensors 30 will be measuring the values of the magnetic field at 220 kilo samples per second (i.e. nominally 440 samples in one cycle), as explained above. Thus, by looking at the changes in the value of the field $B_{irr}$ against the exact time, it will be possible to quickly determine disturbances that have occurred in the electric power transmission network.

Conceptually the change in the magnetic field can be explained as follows. Suppose that there is an interruption in the electric power transmission line 20 connecting the power station A, B or C to the electric power transmission network. This will mean that the power station A, B or C sees a lower load and as a result the generators within the power station are likely to accelerate because they are initially supplying the same amount of power to a lower load. It will take at least several seconds if not several minutes to adjust to the lower load. The result of this will be that the current being transmitted through the electric power transmission line 20 will rise more quickly than would have otherwise been expected. In other words the value of the magnetic field $B_{irr}$ about the electric power transmission network will rise more steeply over time compared to the normal or expected value of the magnetic field $B_n$. Similarly if there is an additional load placed on the electric power transmission network, then the generators in the power stations A, B or C will at least for the first few seconds of minutes produce the same amount of power, but will have a substantially higher load. In other words the amount of current over time will decrease and as a result the slope of the magnetic field $B_{irr}$ will be reduced since the same amount of current is being supplied to a higher load. There will always be a time difference between the disturbance in the electric power transmission network and the effects recorded by the magnetic field sensors 30 on account of the change in the current being delivered.

It was noted of that that the microprocessor 330 stores typically 440 digital values for each nominal period of the current. This digitalization of values of magnetic fields allows a fast determination of the sinus curve and a deviation from the expected waveform shape of the sinus curve and such changes can be determined within less than one cycle. This is also valid for the voltage sensor.

There are more than one of the magnetic field sensors 30 that measure the change in the magnetic field $B_{irr}$. Thus by using the results from a plurality of the magnetic field sensors 30 it is possible to calculate the points and times at which the changes in the magnetic field $B_{irr}$ occur and the amount of the changes. By knowledge of the delays at each one of the magnetic field sensors 30 it is possible to calculate the distance to the disturbance on the electric power transmission network. This calculation will allow a location of the disturbance on the electric power transmission network. Preferably, more than one of the results of the changes in the in the magnetic field $B_{irr}$ at the magnetic fields sensors 30 are evaluated as this will enable the localization of the disturbance on the electric power transmission network more accurately by solving equations relating to the transmission of the electric power.

The above aspects of the invention have been described with respect to the measurement of the magnetic field $B_{irr}$ about the electric power transmission line. The effect of the disturbance in the electric power transmission network can also be seen at the voltage sensor 50. In other words, it might also be possible to record and measure disturbances in the electric power transmission network by having a plurality of voltage sensors 50 distributed about the electric power transmission network. It will, of course, be realized that the use of the voltage sensor 50 in a low voltage network means that additional effects may occur in the down-conversion of the voltage to 230V that can confuse the results about the location of the disturbance in the electrical power transmission network. These additional factors will need to be taken in to account when calculating the location of the disturbance.

Another way to find the direction of the power and power factor will now be described. In this example, the power factors and the direction of the power can also be determined by signal analysis. The magnetic field sensor 30 analyzes the shape of the measured alternating current signal. Ideally, the shape of the measured alternating current signal is a sinus with a fixed time period T (T=1/50 s in Europe or T=1/60 s in US). In practice, the power grid's alternating current sinusoidal waveform has deviations from a perfect sinusoid waveform as discussed above. As an example a transformer station with a high grade of saturation (e.g. at maximum throughput) will cause harmonic frequencies superimposed on the nominal sinusoidal waveform both on the input currents and on the output currents. These harmonics may be of a frequency in the range 1000-2000 Hz, for example, and will overlay and deviate the sinus of the measured alternating current signal at nominal frequency.

Figure 7:
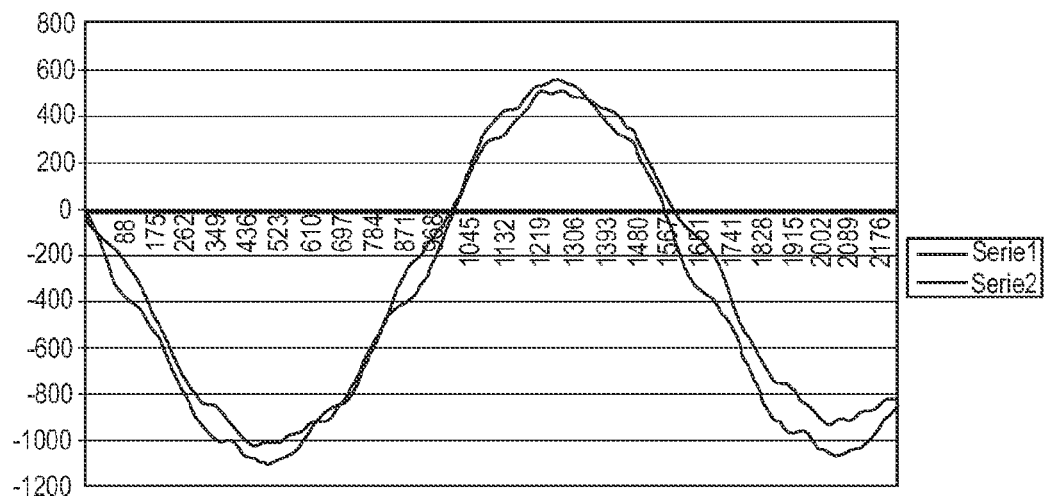
FIG. 7 shows the power flow from Sweden to Norway

FIG. 7 shows two examples of a 50 Hz sinusoidal waveform with superimposed higher frequencies. The term "sinus-noise" will be used for these deviations from the ideally preferred shape. Some of this sinus-noise will be related to the voltage, some of the sinus-noise related to the current and some of the sinus-noise related to the U×I phase angle. For the main part of the sinus-noise there will be a correlation of the contribution to voltage noise, current noise and U×I phase angle noise at the same time. Using the magnetic field sensors 30 it is only possible to inspect the sinus-noise related to the current, so the focus is on the sinus-noise seen on the current signal. Owing to the physical relation between the current sinus-noise and the U×I phase angle it is then possible to determine the U×I phase angle indirectly from the sinus-noise in the current signal. It is hence possible to determine from the U×I phase angle the direction of the power and the reactive power.

Figure 6:
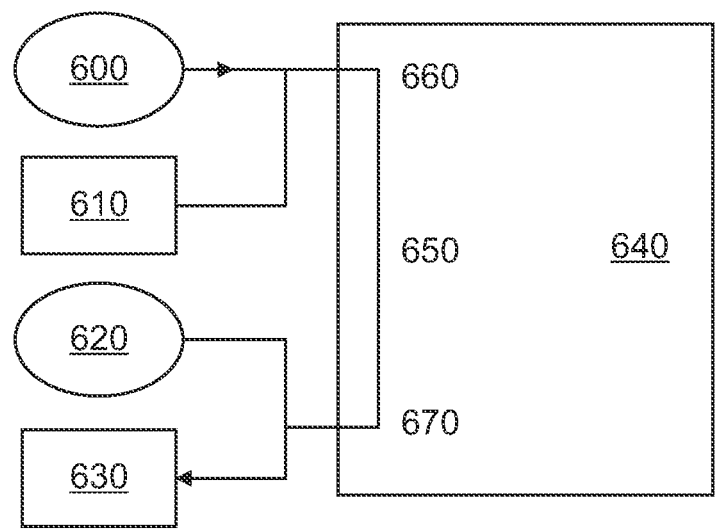
FIG. 6 illustrates an example of the determination of power flow direction

FIG. 6 illustrates a computation done on an electrical power transmission line 20 to determine the direction of the power. FIG. 6 shows a pair of sinusoidal power sources 600 and 620 that supply power to consumers 610 and 630. To illustrate the problem we have introduced a "black box" with which we measure inside without any information from outside. If we measure the alternating current in a black box 640 at a middle point 650 we shall see the charge carriers moving in one half of the cycle from point 660 to point 670. In the other half of the cycle from point 670 to point 660—ideally in the form of a sinusoidal waveform. If previously we know the RMS voltage of the circuit then this will enable us to calculate the amount of electric power, but not the direction or the active part. It will not be possible to determine whether the power is flowing towards the point 660 or towards the point 620.

Almost all circuits have some kind of asymmetry. This will be also true at the middle point 650 of the circuit of FIG. 6. By carefully inspecting the current signature of the alternating current signal in the circuit, one will normally see that the alternating current signal does not have a perfect sinusoidal waveform as described above. The alternating current signal will be normally asymmetric. This asymmetric deformation of the sinusoidal waveform will normally be changed or just mirrored when the power direction changes, using this information we are able to determine when the power direction changes.

Figure 8:
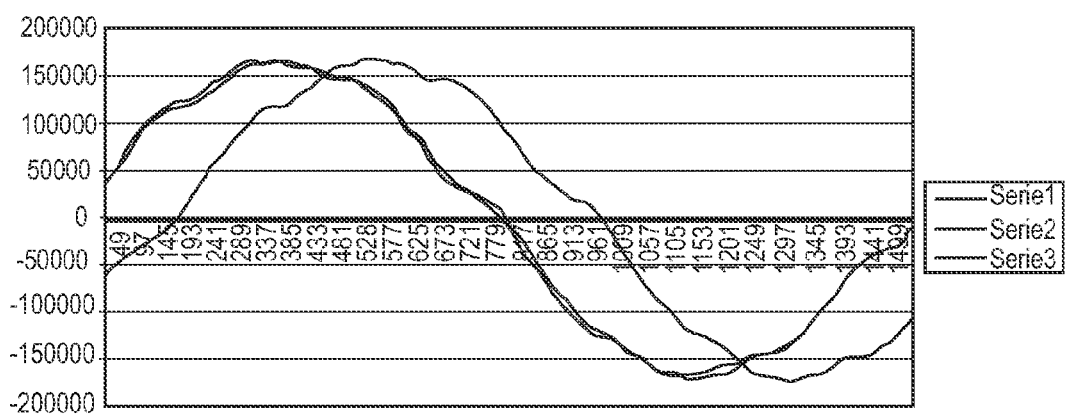
FIG. 8 illustrates the determination of the direction of power flow.

Consider FIGS. 7 and 8 that show examples of two measurements of the current on the electric power transmission line 20 from Norway to Sweden. The first measurement denoted by "serie1" is done when there is a flow of electric power from Norway to Sweden. The second measurement denoted by "serie2" is done about 1 hour later when there is a flow of electric power from Sweden to Norway. By carefully matching the graphs by mirroring them and making appropriate adjustment one can clearly see that the shape is substantially identical. The appropriate adjustment can be, by way of example, to multiply by a factor k and/or to shift the graph in the time domain.

This is shown in FIG. 8. As can be seen, the curve "Serie2" in FIG. 8 (where the electric power flow is in the opposite direction of curve Serie1 1 hour earlier) is now scaled by a factor k and "mirrored" to fit the curve "Serie1". The curve "Serie3" is the same as the curve "Serie2", but just shifted in time in order to fit to the curve "Serie1". By doing this we see that we can get a better match of the two measurements, and further conclude that the flow of the electric power has changed direction. If the power had not changed direction in the two measurements we should see that the curve Serie1 and the curve Serie2 in FIG. 8 would match better than the curve Serie1 and the curve Serie2 curves in the FIG. 9.

This simple example and analysis shows it is possible to determine the change in the power direction without knowing or measuring the voltage in the circuit.

This can be done mathematically using the microprocessor 330 of the measurement unit 30 or in the processor 40 by storing a set of digitized values of one period of the sinusoidal waveform of the alternating current signal Ito give a set of values $I_1$. The set of digitized values is mirrored to give a set of mirrored digitized values, $I_{m1}$. An error value $E_1$ is calculated by comparing the set of digitized values $I_i$ with the set of mirrored digitized values $I_{mi}$. Subsequently a new set of digitized values of the sinusoidal waveform, $I_2$ is stored and a new error value $E_2$ is calculated by comparing the new set of digitized values $I_2$ with its mirror image.

If $E_2$ is less than $E_1$ then the power has changed direction.

As mentioned above, a physical cause of this sinus-noise can be a transformer that is close to saturation. Due to the saturation, the voltage in the transformer will then be distorted by superimposed harmonics. There is a physical relation between the voltage and the current in the electric power transmission lines 20 coupled to the input and output windings of the transformer, so that the harmonics will also be superimposed on the sinusoidal waveform of the alternating current signal. The harmonics will not follow the U×I phase angle of the nominal frequency, but will vary slightly for example due to different impact from the reactance and capacitive load.

By even more detailed analysis of the shape it is also possible to determine the U×I phase angle, the capacitive/inductive load, the disturbances of the power grid, as well as other parameters that characterize the power production, the power grid and the consumer etc. This detailed analysis can be performed by carrying out a Fourier transform? transformation of the waveform.

This analysis and information can either be used in real time inside the magnetic field sensor 30 or the information can be transferred to the processor 40, where the information can be further analyzed in combination with other information from the power grid.

Figure 10:
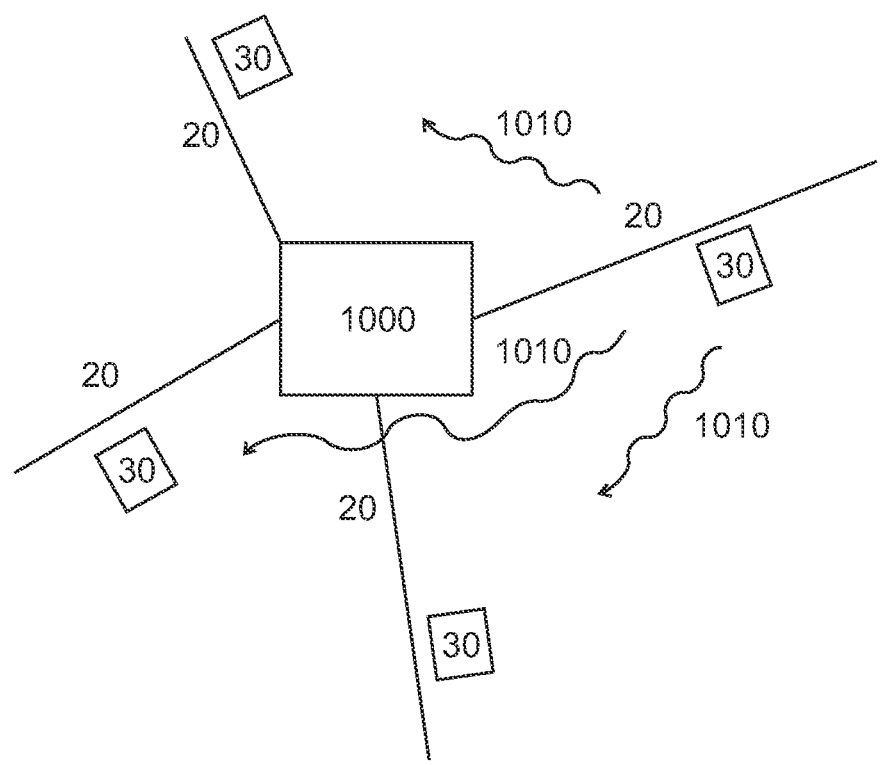
FIG. 10 shows electric power lines about a power station

Under normal circumstances (i.e. without any disturbances in the electric power transmission network) the magnetic field sensors 30 and/or the voltage sensor 50 measure the current flying through the electric power transmission line 20 or at the low voltage network and send the values approximately every second to the processor 40 for evaluation. Should one of the magnetic field sensors 30 or the voltage sensor 50 detect a disturbance in the electric power transmission network, then the magnetic field sensor 30 and/or the voltage sensor 50 can send a "wake-up" signal as shown in FIG. 10 to other ones of the magnetic field sensors 30 or voltage sensors 50. The wake-up signal is generated by a signal generator, such as but not limited to, the wireless LAN transceiver 34 disclosed earlier. This wake-up signal 1010 instructs the magnetic field sensors 30 or the voltage sensors 50 to send data on a more frequent basis, possibly on a continuous basis, to the processor 40 in order to allow for accurate evaluation of the disturbance by multiple ones of the voltage sensors 50 and the magnetic field sensors 30. It is also possible for the wake-up signal 1010 to be initiated by the processor 40. The wake-up signal 1010 is preferably transmitted by a radio frequency, rather than by the GPRS network, as this is quicker.

An example of this is shown in FIG. 10 that illustrates a power station connected to an electric power transmission network through a plurality of electric power transmission lines. The current flowing through the electric power transmission lines 20 is monitored by one or more magnetic field sensors 30 located near to the electric power transmission lines 20, as described above. Until a disturbance is detected, each of the magnetic field sensors 30 sends data on a regular basis to the raw data storage processor 210. On detection of the disturbance in the electric power transmission network, the wake-up signal 1010 is forwarded to all of the magnetic field sensors located about the power station 1000. It will be appreciated that not all of the magnetic field sensors 30 need to be woken-up to send data more frequently, but this is generally advantageous as the disturbance in the power station 1000 can be analyzed more accurately.

It will be appreciated that aspects of this invention can be implemented in hardware or in software and that the choice is one left to the skilled person to decide. Merely as an example, implementation in software is done by programming a series of instructions in a suitable computer language, such as but not limited to Basic, C++, Perl or Java.

The foregoing description of the embodiments of the invention have been presented for purposes of illustration and description. They are not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents.

| Reference Numerals | Names |
| --- | --- |
| 10 | Apparatus |
| 20 | Electric Power Transmission Line |
| 25 | Pylons |
| 26 | Base |
| 30 | Magnetic Field Sensor |
| 33 | First Datalines |
| 34 | Wireless LAN Transceiver |
| 35 | Magnetic field |
| 36 | Mobile Data Access Interface |
| 37 | Magnetic Field Data |
| 38 | Clock |
| 39 | Container |
| 40 | Processor |
| 45 | Network |
| 50 | Voltage Sensor |
| 53 | Second data lines |
| 55 | Voltage waveform data |
| 60 | Transform waveform calculator |
| 65 | Look-up Table |
| 200 | Authentification Check |
| 210 | Raw Data Storage Processor |
| 220 | Raw Database |
| 230 | Predict Data Processor |
| 240 | Field Description Database |
| 250 | Data Calculation module |
| 255 | Value Database |
| 260 | Grid Configuration Module |
| 270 | Statistics and Probability database |
| 280 | Economic Feature Database |
| 290 | Estimator Module |
| 295 | Database Mirrors Database |
| 310 | Sensing coil |
| 315 | Amplifier |
| 320 | A/D Converter |
| 330 | Microprocessor |
| 340 | Global Positioning and Time Unit |
| 350 | Mobile data transmission Module |
| 400 | Domestic Power Outlet |
| 410 | Resistance |
| 420 | Resistance |
| 430 | Ground |
| 440 | Comparator |
| 450 | Reference voltage |
| 460 | Output |
| 600 | Sinusoidal Power Source |
| 610 | Consumer |
| 620 | Sinusoidal Power Source |
| 630 | Consumer |
| 640 | Black Box |
| 650 | Middle Point |
| 660 | Point |
| 670 | Point |
| 1000 | Power Station |
| 1010 | Wake-Up Signal |

The invention claimed is:

1. A method for determining a change in power grid parameters of an electric power transmission network, the electric power transmission network comprising a plurality of electric power transmission lines, the method comprising:
monitoring a magnetic field about at least one of the electric power transmission lines using a first magnetic field sensor located at a first distance from the at least one of the electric power transmission lines;
transmitting data from said magnetic field sensor to a processor;
determining with said processor from said data transmitted to said processor from said magnetic field sensor a first change over time in a value of the magnetic field at the first magnetic field sensor;
comparing with said processor the first change over time in the value of the magnetic field with a first magnetic field reference value, and thereby determining a presence of the change in power grid parameters.

2. The method of claim 1, wherein the first magnetic field reference value is an updateable value.

3. The method of claim 1, wherein the first magnetic field reference value is an expected waveform.

4. The method of claim 1, wherein the monitoring of the magnetic field comprises sampling digitally the magnetic field to produce a series of digital values representative of the value of the magnetic field at known ones of the times.

5. The method of claim 4, wherein the determining of a change in the value of the magnetic field comprises comparing members of the series of digital values against the known times.

6. The method of claim 1, further comprising:
determining a second change over time in a value of the magnetic field at a second magnetic field sensor;
comparing the first change with the second change to determine the presence of the change in power grid parameters.

7. The method of claim 6, further comprising determining location of the change in power grid parameters using the times of the first change and the second change and by means of a grid transfer function.

8. The method of claim 1, further comprising sending a wake-up signal to one or more of the first magnetic field sensors on determination of the change in the power grid parameters.

9. The method of claim 1, further comprising forecasting with said processor from a determined presence of a change in power grid parameters at least one of demand, commodity costs or power plant fuel value.

10. A method for determining a change in power grid parameters of an electric power transmission network, the electric power transmission network comprising a plurality of electric power transmission lines, the method comprising:
monitoring a voltage about at least one of the electric power transmission lines using by a first voltage sensor located at a first distance from the at least one of the electric power transmission lines;
transmitting data from said voltage sensor to a processor;
storing data transmitted from said voltage sensor in a database;
determining with said processor from said data transmitted to said processor from said voltage sensor a first change over time in a value of the voltage at the first voltage sensor;
comparing with said processor the first change in the value of the voltage with a first voltage reference value, and thereby determining the change in power grid parameters.

11. The method of claim 10, wherein the first voltage reference value is an updateable value.

12. The method of claim 10, wherein the first voltage reference value is an expected waveform.

13. The method of claim 10, wherein the monitoring of the voltage comprises sampling digitally values of the voltage to produce a series of digital values representative of the value of the voltage at known ones of the times.

14. The method of claim 10, wherein the determining of a change in the value of the voltage comprises comparing members of the series of digital values against the known ones of the times.

15. The method of claim 10, wherein the voltage sensor is at a low-voltage part of the electric power transmission network.

16. The method of claim 10, further comprising:
determining a second change in a value of a second voltage measured at a second voltage sensor;
comparing the first change with the second change to determine the presence of the change in power grid parameters.

17. The method of claim 16, further comprising determining location of the change in power grid parameters using the times of the first change and the second change and by means of a grid transfer function.

18. The method of claim 10, further comprising sending a wake-up signal to one or more of the first voltage sensors on determination of the change in power grid parameters.

19. The method of claim 10, further comprising forecasting with said processor at least one of demand, commodity cost and power plant fuel value based on a determined presence of a change in power grid parameters.

20. An apparatus for determining a change in power grid parameters of an electric power transmission network, the electric power transmission network comprising a plurality of electric power transmission lines, the apparatus comprising:

at least one of a voltage sensor or a magnetic field sensor located at a first location at a first distance from at least one of the plurality of electric power transmission lines for sensing a magnetic field or a voltage associated with said power transmission lines;
one or more data lines for transferring data from the at least one of a voltage sensor or a magnetic field sensor, wherein said data comprises substantially real-time field data measured by said at least one of a voltage sensor or a magnetic field sensor, said field data comprising at least one of a magnetic field or a voltage associated with said power transmission lines; and
a processor, said processor receiving data transferred by said one or more data lines, analysing the received data and determining changes in a value of said field data against time, and thereby determining the change in power grid parameters on the power grid by comparison to a reference value.

21. The apparatus of claim 20, wherein the reference value is an updateable value.

22. The apparatus of claim 20, wherein the reference value is an expected waveform.

23. The apparatus of claim 20, wherein the data lines are radio channels.

24. The apparatus of claim 20, further comprising a plurality of magnetic field sensors located proximate to at least one of the one or more data lines.

25. The apparatus of claim 20, further comprising a field description database for storing of states representative of a configuration and operation of the electric power transmission network.

26. The apparatus of claim 20, further comprising a statistic and probability database for determining a probability of a state of the configuration of the electric power transmission network.

27. The apparatus of claim 20, further comprising a wake-up signal generator for causing at least one sensor to provide additional data to the processor.

28. The apparatus of claim 20, wherein the processor is adapted to determine at least two changes in a value and compare a first one of the at least two changes with a second one of the at least two changes to determine the location of the change in power grid parameters.

29. The apparatus of claim 20, further comprising:
a field description database comprising power network data received from said voltage sensor and said processor;
a statistic and probability database, wherein said statistic and probability database uses the data in the field description database and historical data to describe a condition of electric power generation and the electric power transmission systems; and
an estimator module, wherein said estimator module receives a current state of electric power transmission system from said field description database and receives statistics and probabilities from said statistics and probability database and constructs new possible power grid states with estimated probabilities.

30. The apparatus of claim 29, wherein the estimator is adapted to forecast at least one of demand, power plant fuel value or commodity cost.

* * * * *